United States Patent
Liu et al.

(10) Patent No.: US 12,460,734 B2
(45) Date of Patent: Nov. 4, 2025

(54) PRESSURE PROTECTION DEVICE AND IMMERSION COOLING DEVICE

(71) Applicant: Fulian Precision Electronics (Tianjin) Co., LTD., Tianjin (CN)

(72) Inventors: Tsung-Lin Liu, Neihu (TW); Chun-Wei Lin, New Taipei (TW)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 169 days.

(21) Appl. No.: 18/520,100

(22) Filed: Nov. 27, 2023

(65) Prior Publication Data

US 2024/0344626 A1 Oct. 17, 2024

(30) Foreign Application Priority Data

Apr. 11, 2023 (CN) .......................... 202320791031.8

(51) Int. Cl.
*F16K 17/194* (2006.01)
*H05K 7/20* (2006.01)

(52) U.S. Cl.
CPC ....... *F16K 17/194* (2013.01); *H05K 7/20236* (2013.01); *H05K 7/20272* (2013.01); *H05K 7/20763* (2013.01)

(58) Field of Classification Search
CPC ... F16K 17/19; F16K 17/194; H05K 7/20236; H05K 7/20272; H05K 7/20763; H05K 7/203; H05K 7/20327; H05K 7/20818; Y10T 137/7772–7776
USPC ........................................... 137/493.1–493.5
See application file for complete search history.

(56) References Cited

U.S. PATENT DOCUMENTS

| | | | | |
|---|---|---|---|---|
| 21,535 A * | 9/1858 | Hardy et al. | ............ | F16K 17/19 |
| | | | | 137/493.2 |
| 1,856,996 A * | 5/1932 | Heise | .................... | F16K 17/196 |
| | | | | 137/513 |
| 2,016,278 A * | 10/1935 | Ehlers | ..................... | F16K 17/36 |
| | | | | 137/541 |
| 2,045,780 A * | 6/1936 | Jett | ........................ | F16K 17/196 |
| | | | | 137/493.6 |

(Continued)

FOREIGN PATENT DOCUMENTS

| WO | WO-2022041836 A1 * | 3/2022 | ............... F16K 1/46 |
| WO | WO-2022043621 A1 * | 3/2022 | ........... F16K 17/196 |

(Continued)

*Primary Examiner* — Marina A Tietjen
(74) *Attorney, Agent, or Firm* — ScienBiziP, P.C.

(57) ABSTRACT

A pressure protection device includes a housing, a sliding block, and an adjusting block. The housing includes a receiving chamber communicating with a seal chamber and the housing defines a first gas hole and a second gas hole each communicating the receiving chamber to an ambient environment. The sliding block divides the receiving chamber into a first space and a second space and defines a through hole communicating the first space with the second space. The adjusting block is located in the first space and configured to be attracted to the sliding block so that the through hole is selectively blocked by the adjusting block. When the sliding block slides in the receiving chamber, the first gas hole is selectively blocked by the sliding block to isolate from or to communicate with the first space, and the second gas hole always communicates with the second space.

20 Claims, 3 Drawing Sheets

(56) References Cited

U.S. PATENT DOCUMENTS

| | | | | | |
|---|---|---|---|---|---|
| 3,108,610 | A | * | 10/1963 | De See | F16K 17/196 |
| | | | | | 137/550 |
| 4,125,126 | A | * | 11/1978 | Davis, Jr. | F16K 17/18 |
| | | | | | 137/493.1 |
| 4,171,712 | A | * | 10/1979 | DeForrest | F16K 15/063 |
| | | | | | 137/538 |
| 5,282,492 | A | * | 2/1994 | Angeli | F16K 17/196 |
| | | | | | 137/493.4 |
| 2021/0148643 | A1 | * | 5/2021 | Tung | F28D 15/02 |

FOREIGN PATENT DOCUMENTS

| | | | | | |
|---|---|---|---|---|---|
| WO | WO-2022068691 | A1 | * | 4/2022 | H05K 7/20 |
| WO | WO-2022236491 | A1 | * | 11/2022 | F16K 17/40 |

* cited by examiner

PRESSURE PROTECTION DEVICE AND IMMERSION COOLING DEVICE

FIELD

The subject matter herein generally relates to the field of air pressure control technology, in particular to a pressure protection device and an immersion cooling device.

BACKGROUND

A server is usually placed in a seal chamber containing coolant for cooling. When the coolant absorbs heat generated by the server and is gasified, evaporates, air pressure in the seal chamber is increased. A pressure protection device is needed to control the air pressure in the seal chamber within a preset pressure.

BRIEF DESCRIPTION OF THE DRAWINGS

Implementations of the present technology will now be described, by way of embodiment, with reference to the attached figures.

DETAILED DESCRIPTION

Figure 1:
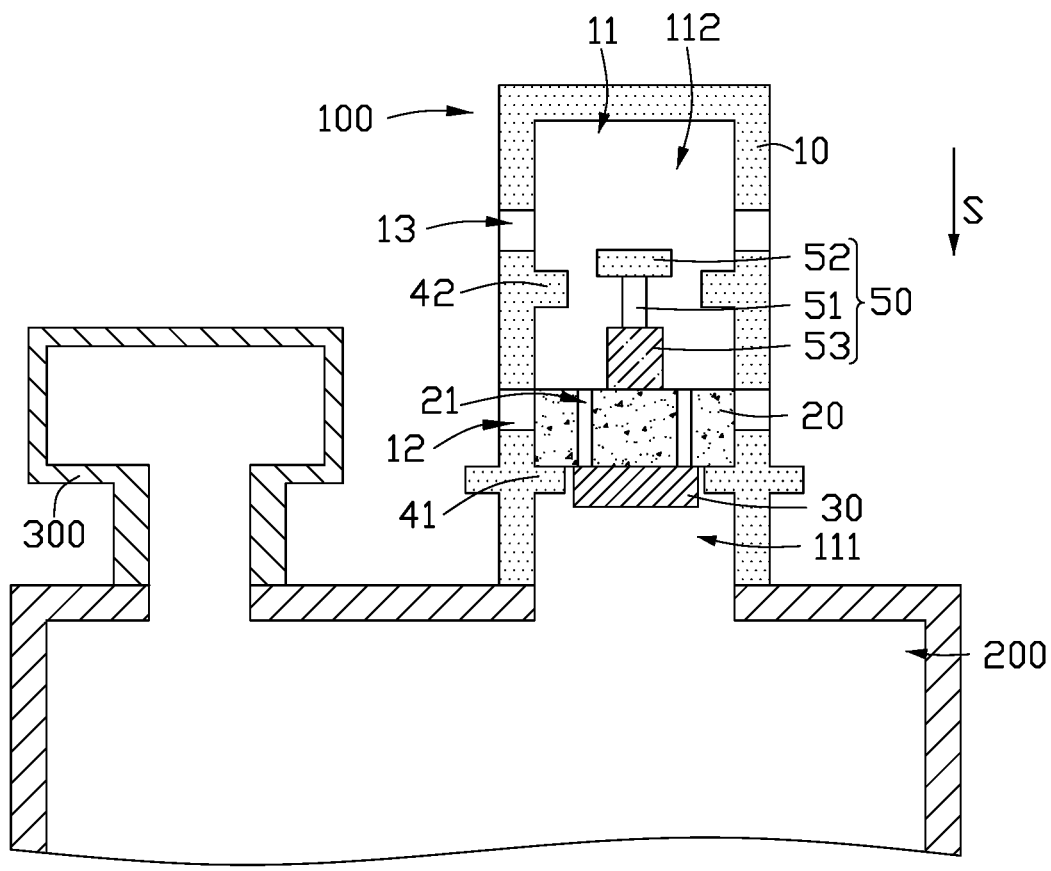
FIG. 1 is a cross section view illustrating a pressure protection device in a first state according to an embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

Several definitions that apply throughout this disclosure will now be presented.

The term "connected" is defined as connected, whether directly or indirectly through intervening components, and is not necessarily limited to physical connections. The connection can be such that the objects are permanently connected or releasably connected. The term "substantially" is defined to be essentially conforming to the particular dimension, shape, or other feature that the term modifies, such that the component need not be exact. For example, "substantially cylindrical" means that the object resembles a cylinder, but can have one or more deviations from a true cylinder. The term "comprising," when utilized, means "including, but not necessarily limited to;" it specifically indicates open-ended inclusion or membership in the so-described combination, group, series, and the like.

Figure 2:
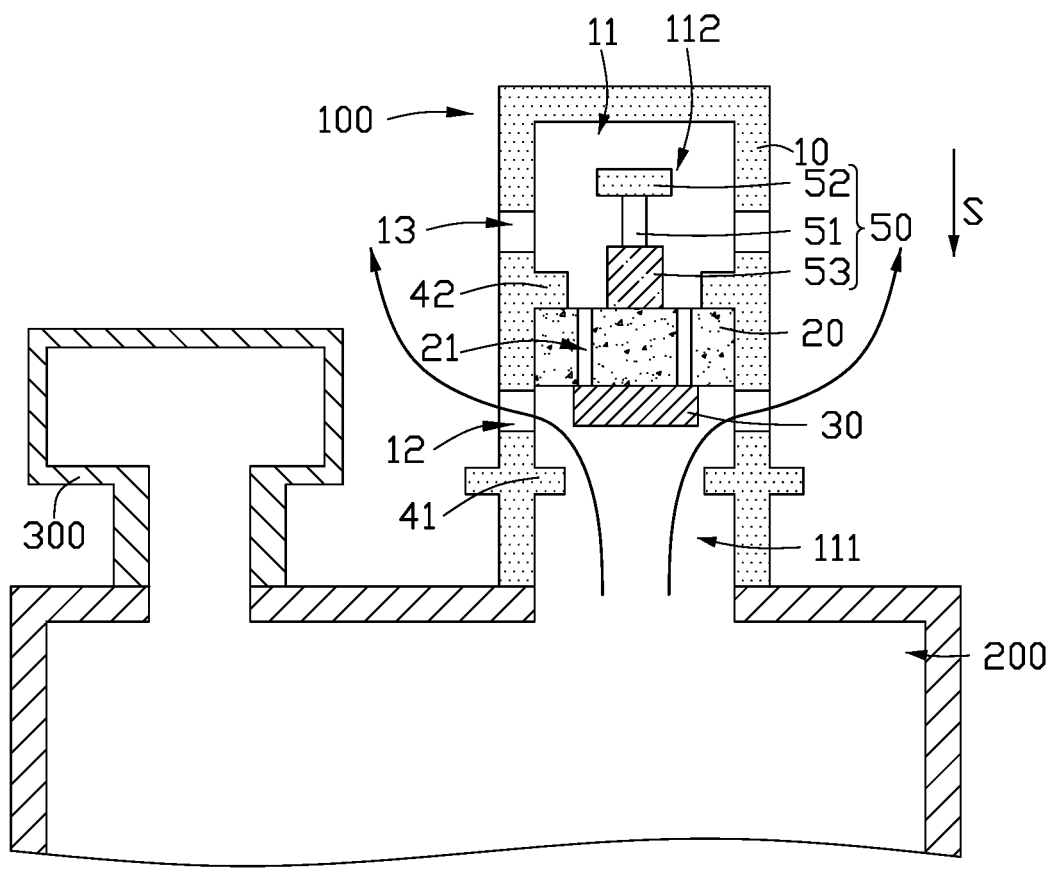
FIG. 2 is a cross section view illustrating the pressure protection device in FIG. 1 in a second state according to an embodiment of the present disclosure.
Figure 3:
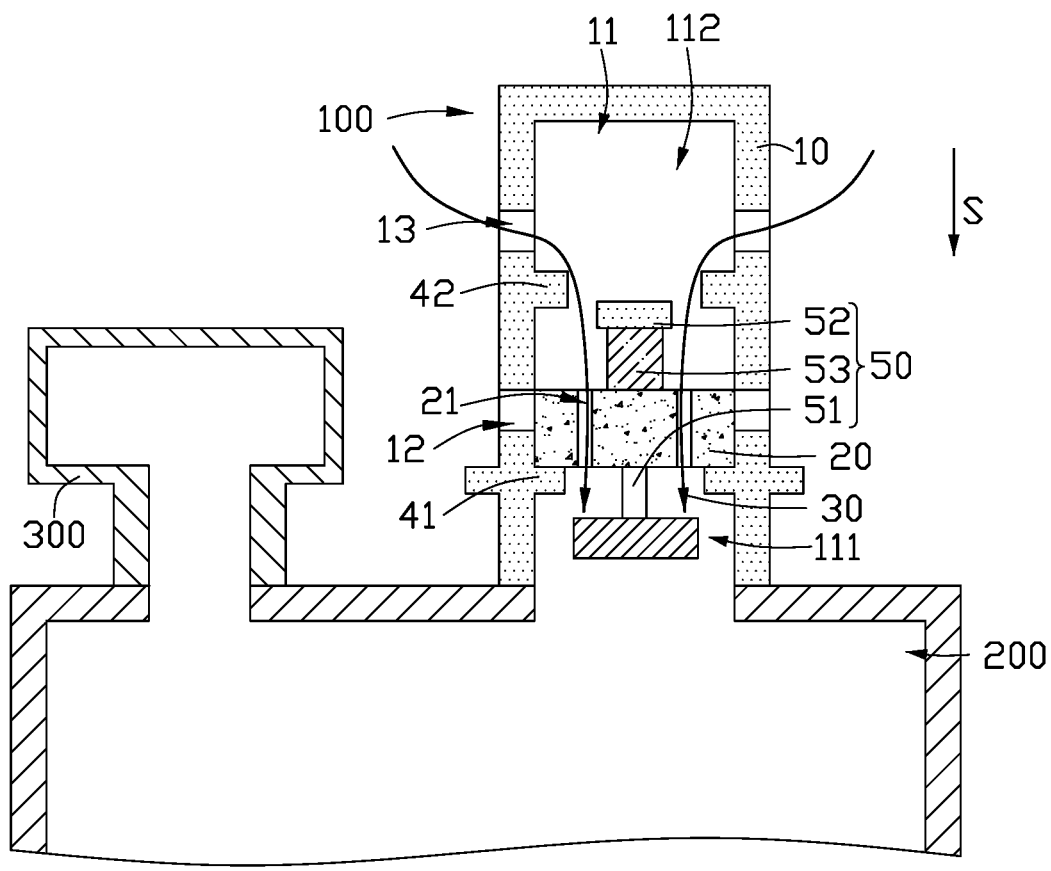
FIG. 3 is a cross section view illustrating the pressure protection device in FIG. 1 in a third state according to an embodiment of the present disclosure.

Referring to FIGS. 1, 2, and 3, an embodiment of a pressure protection device 100 is illustrated. The pressure protection device 100 is mounted on and supported over a seal chamber 200 and is configured to protect the seal chamber 200. The pressure protection device 100 includes a housing 10, a sliding block 20, and an adjusting block 30. The housing 10 has a receiving chamber 11 communicating with the seal chamber 200. The housing 10 defines a first gas hole 12 and a second gas hole 13. Each of the first gas hole 12 and the second gas hole 13 spatially communicates with the receiving chamber 11 with an ambient environment. The first gas hole 12 is closer to the seal chamber 200 than to the second gas hole 13. The sliding block 20 is slidably disposed in the receiving chamber 11 and is tightly abutted against an inner wall of the receiving chamber 11. The sliding block 20 divides the receiving chamber 11 into a first space 111 and a second space 112 which are isolated from each other. The first space 111 spatially communicates with the seal chamber 200. The sliding block 20 defines a through hole 21 which spatially communicates with the first space 111 with the second space 112.

When the sliding block 20 slides along the inner wall of the receiving chamber 11, the first gas hole 12 is selectively blocked by the sliding block 20 to isolate from or communicate with the first space 111, and the second gas hole 13 always communicates with the second space 112. The adjusting block 30 is located in the first space 111. The adjusting block 30 is capable of being attracted to the sliding block 20, so that the adjusting block 30 can be in contact with a surface of sliding block 20 facing the first space 111 and selectively block the through hole 21. One of the sliding block 20 and the adjusting block 30 is a magnetic block, and the other is a metal block. According to applicable scenarios of the pressure protection device 100, gravities of the sliding block 20 and the adjusting block 30 and a magnetic attractive force between the sliding block 20 and the adjusting block 30 can be adjusted, which is more conducive to accurately adjusting the applicable pressure range of the pressure protection device 100.

Referring to FIG. 1, a first state of the pressure protection device 100 is that the sliding block 20 blocks the first gas hole 12, and the adjusting block 30 blocks the through hole 21. In the first state, an air pressure in the first space 111 is in a normal state, that is, an air pressure in the first space 111 and the sealing chamber 200 is the same as an external air pressure of the pressure protection device 100. In the first state, the second gas hole 13 communicates with the ambient environment, and the air pressure in the second space 112 is the same as the atmosphere pressure.

Referring to FIG. 2, a second state of the pressure protection device 100 is that the sliding block 20 slides away from the seal chamber 200 until the sliding block 20 is separated from the first gas hole 12, and the adjusting block 30 blocks the through hole 21. In the second state, the first gas hole 12 is opened, and the first gas hole 12 spatially communicates with the first space 111. When the air pressure in the first space 111 and the seal chamber 200 is a positive pressure, that is, when the air pressure in the first space 111 and the seal chamber 200 is greater than the atmospheric pressure, the air pressure in the first space 111 is greater than the air pressure in the second space 112. In this case, when the air pressure in the first space 111 is greater than a sum of the gravities of the sliding block 20 and the adjusting block 30 and the air pressure in the second space 112, the sliding block 20 and the adjusting block 30 slide in the opposite direction of a preset direction S which refers to a direction from the second space 112 to the first space 111 until the first gas hole 12 is opened, and the gas in the first space 111 is discharged to the ambient environment through the first gas hole 12 to achieve the release of pressure in the first space 111, thereby balancing the air pressure difference between the inside and the outside of the first space 111, protecting the seal chamber 200, and reducing the risk of deformation or damage of devices in the seal chamber 200 due to excessive pressure.

Referring to FIG. 3, a third state of the pressure protection device 100 is that the sliding block 20 is separated from the adjusting block 30, the sliding block 20 blocks the first gas hole 12, and the first space 111 communicates with the ambient environment through the through hole 21. When the air pressure in the first space 111 is less than the air pressure in the second space 112, the air pressure in the first space 111 and the sealing chamber 200 is a negative pressure. Since the air pressure in the second space 112 is greater than the air pressure in the first space 111, the sum of the air pressure in the second space 112 and the gravities of the sliding block 20 and the adjusting block 30 is greater than the air pressure in the first space 111, so that the sliding block 20 blocks the first gas hole 12, and the first gas hole 12 cannot communicate with the first space 111. At the same time, a push force applied by the gas in the second space 112 to the adjusting block 30 through the through hole 21 is greater than the magnetic force between the sliding block 20 and the adjusting block 30, causing the adjusting block to be separated from the sliding block 20. In this case, gas in the ambient environment is introduced into the first space 111 through the second gas hole 13 and the through hole 21, thereby balancing the air pressure difference between the inside and the outside of the first space 111.

In some embodiments, the housing 10 is provided with a support platform 41 on the inner wall of the receiving chamber 11. The support platform 41 is configured to support the sliding block 20. The first gas hole 12 and the second gas hole 13 are both located above the support platform 41. When the pressure protection device 100 is in the first or third state, the sliding block 20 is supported on the support platform 41. In some embodiments, the support platform 41 is a circular protrusion extending from the inner wall of the receiving chamber 11 and surrounding a periphery of the receiving chamber 11.

In some embodiments, the sliding block 20 is substantially cylindrical or has a cubic shape.

In some embodiments, the sliding block 20 and the adjusting block 30 are both magnetic blocks, such as magnets.

In some embodiments, the sliding block 20 is a metal block, and the adjusting block 30 is a magnetic block. Compared to the sliding block 20 being a magnetic block, when the sliding block 20 is a metal block and the adjusting block 30 is a magnetic block, the adjusting block 30 can be directly replaced as needed when adjusting the pressure usage range of the pressure protection device 100, which is more convenient.

Referring to FIG. 1, in some embodiments, the pressure protection device 100 further includes a limiting member 50. The limiting member 50 includes a movable shaft 51, a limit block 52, and an assembly member 53. The movable shaft 51 slidably extends through the sliding block 20. An end of the movable shaft 51 is fixedly connected to the adjusting block 30, and the other end of the movable shaft 51 is fixedly connected to the limit block 52. The assembly member 53 is sleeved on the movable shaft 51 and is located between the limit block 52 and the sliding block 20.

Referring to FIG. 1, when the pressure protection device 100 is in the first state, that is, when the air pressure in the first space 111 is equal to the external air pressure, the adjusting block 30 abuts against a bottom surface of the sliding block 20 and blocks the through hole 21, and the limit block 52 is separated from a top surface of the sliding block.

Referring to FIG. 2, when the pressure protection device 100 is in the second state, that is, when the air pressure in the first space 111 and the seal chamber 200 is a positive pressure, the gas in the first space 111 pushes the sliding block 20, the adjusting block 30, and the limiting member 50 to move in the opposite direction to the preset direction S until the sliding block 20 and the first gas hole 12 are staggered from each other. In this case, the first gas hole 12 communicates with the sliding block 20, gas in the first space 111 is discharged to the ambient environment through the first gas hole 12 until the air pressure in the first space 111 is equal to the atmosphere pressure. When the sliding block 20, the adjusting block 30, and the limiting member 50 move in the opposite direction to the preset direction S until the air pressure in the first space 111 is equal to the atmosphere pressure, the sliding block 20, the sliding block 20 slides again to the support platform 41, causing the pressure protection device 100 to be in the first state.

Referring to FIG. 3, when the pressure protection device 100 is in the third state, that is, when the air pressure in the first space and the seal chamber 200 is a negative pressure, gas in the ambient environment pushes the adjusting block 30 away from the sliding block 20 through the through hole 21 until the sliding block 20 is separate from the adjusting block 30 to open the through hole 21. In this case, the adjusting block 30 moves in the preset direction S, and the limit block 52 is configured to limit a moving distance of the adjusting block 30.

In some embodiments, the assembly member 53 is circular and is sleeved on the movable shaft 51. When the pressure protection device 100 is in the third state, the sliding block 20 is separated from the adjusting block 30, the limit block 52 abuts against the assembly member 53, and the assembly member 53 supports and limits the limit block 52.

In other embodiments, the assembly member 53 is an elastic member. When a state of the pressure protection device 100 is switched from the third state to the first state, the air pressure in the first space 111 is equal to the air pressure in the second space 112, and the elastic member 53 imparts a force in the opposite direction to the preset direction S to the limit block 52, so that a distance between the limit block 52 and the top surface of the sliding block 20 is increased until the adjusting block 30 abuts against the sliding block 20 and the through hole 21 is blocked. The elastic member plays an elastic reset role on the adjusting block 30, and the adjusting block 30 is reset by the elastic member after an elastic restoring force of the elastic member is released. In some embodiments, the elastic member is a spring, such as a tension spring or a torsion spring.

In some embodiments, a central axis of the movable shaft 51 coincides with a central axis of the sliding block 20, which improves the stability of the movement of the adjusting block 30.

In some embodiments, a sealing ring (not shown) is disposed between the sliding block 20 and the housing 10. The sealing ring surrounds the periphery of the sliding block 20, thereby improving the sealing performance of the first space 111 when the sliding block 20 is in the first state. In some embodiments, the surface of the support platform 41 facing the sliding block 20 is provided with a sealing ring to further improve the sealing performance of the first space 111.

In some embodiments, the housing 10 defines a plurality of first gas holes 12 and a plurality of second gas holes 13. The first gas holes 12 are spaced from each other and are arranged symmetrically around the central axis of sliding block 20. The second gas holes 13 are arranged symmetrically around the central axis of sliding block 20. In some embodiments, there are a plurality of through holes 21.

Referring to FIG. 2, in some embodiments, the housing 10 is further provided with a limit platform 42 on the inner wall of the receiving chamber 11. The limit platform 42 is located between the first gas hole 12 and the second gas hole 13, and the sliding block 20 is located between the support platform 41 and the limit platform 42. When the pressure protection device 100 is in the second state, the top surface of the sliding block 20 abuts against the limit platform 42 to limit a distance that the sliding block 20 slides in the receiving chamber 11 along the preset direction S. The limit platform 42 is also configured to protect the limit block 52 from abutting against a top wall of the housing 10.

The pressure protection device 100 can be applied to any pressure equipment that requires a pressure safety valve. In one embodiment, a case where the pressure protection device 100 is applied to an immersion cooling device 1000 is taken as an example. The immersion cooling device 1000 includes a pressure balance device 300, the seal chamber 200, and the pressure protection device 100. Both the pressure balance device 300 and the pressure protection device 100 spatially communicate with the receiving chamber 11 the sealing chamber 200.

The immersion cooling device 1000 further includes a condenser (not shown) and a coolant (not shown) which are disposed in the seal chamber 200. A server (not shown) is immersed in the coolant. The coolant absorbs heat generated by the server and is gasified, the coolant vapor condenses on the condenser, and the coolant condensed on the condenser falls back into the coolant, so that the coolant is converted between the gas and liquid phases to take away the heat generated by the server. When the air pressure in the seal chamber 200 is equal to the external air pressure, the pressure protection device 100 is in the first state. When a portion of the coolant absorbs heat generated by the server and is gasified, the air pressure in the seal chamber 200 is increased, and the air pressure in the first space 111 and the seal chamber 200 is a positive pressure. In this case, the pressure protection device 100 is in the second state. When the coolant vapor condenses on the condenser, the air pressure in the seal chamber 200 is decreased, and the air pressure in the first space 111 and the seal chamber 200 is a negative pressure. In this case, the pressure protection device 100 is in the third state. When the coolant is converted between the gas and liquid phases, a state of the pressure protection device 100 continuously transitions between the above three states, thereby balancing the air pressure difference between the inside and the outside of the first space 111 and the seal chamber 200.

In some embodiments, the pressure balance device 300 is an airbag or aluminum foil bag with variable volume size. When the air pressure in the seal chamber 200 is changed, the pressure balance device 300 can alleviate the pressure change of the seal chamber 200 and also provide protection for the seal chamber 200.

In the pressure protection device 100, the opening or closing of the through hole 21 is controlled to control whether the external gas flows into the first space 111 by utilizing the attraction between the sliding block 20 and the adjusting block 30 and the gravities of the sliding block 20 and the adjusting block 30. The sliding block 20 is configured to block or open the first gas hole 12, thereby controlling whether the external gas flows into the first space 111 through the first gas hole 12. When the air pressure in the first space 111 is a positive pressure, gas in the first space 111 pushes the sliding block 20 and the adjusting block 30 to move in the preset direction S until the first gas hole 12 is opened. In this case, the first gas hole 12 communicates with the first space 111, and the gas in the first space 111 is discharged to the ambient environment through the first gas hole 12, thereby balancing the air pressure difference between the inside and the outside of the first space 111, protecting the seal chamber 200, and balancing the air pressure difference between the inside and the outside of the seal chamber 200. When the air pressure in the first space 111 is a negative pressure, the adjusting block 30 is pushed to be separated from the sliding block 20 under the air pressure difference between the first space 111 and the ambient environment, and gas in the ambient environment flows into the first space 111 through the through hole 21 to balance the air pressure difference between the inside and the outside of the first space 111. When the air pressure in the first space 111 is changed, the sliding block 20 and/or the adjusting block 30 immediately moves to ensure that the pressure inside and outside the first space 111 remains constant.

While the present disclosure has been described with reference to particular embodiments, the description is illustrative of the disclosure and is not to be construed as limiting the disclosure. Therefore, those of ordinary skill in the art can make various modifications to the embodiments without departing from the scope of the disclosure as defined by the appended claims.

What is claimed is:

1. A pressure protection device configured for protecting a seal chamber, the pressure protection device comprising:
   a housing configured to be mounted on the seal chamber, the housing comprising a receiving chamber communicating with the seal chamber and the housing defining at least one first gas hole and at least one second gas hole each communicating the receiving chamber to an ambient environment, the at least one first gas hole being closer to the seal chamber than to the at least one second gas hole;
   a sliding block slidably disposed in the receiving chamber and dividing the receiving chamber into a first space and a second space, the first space communicating with the seal chamber, the sliding block defining a through hole communicating the first space with the second space; and
   an adjusting block received in the first space, the adjusting block being configured to be attracted to the sliding block so that the through hole is selectively blocked by the adjusting block,
   wherein the pressure protection device is switchable among a first state, a second state, and a third state,
   in the first state, the at least one first gas hole is blocked by the sliding block, and the through hole is blocked by the adjusting block,
   in the second state, the sliding block and the at least one first gas hole are staggered from each other, the at least one first gas hole communicates with the first space, and the through hole is blocked by the adjusting block, and in the third state, the first gas hole is blocked by the sliding block, the adjusting block is separated from the sliding block, and the first space communicates with the ambient environment through the through hole and the second gas hole.

2. The pressure protection device of claim 1, further comprising a support platform disposed on an inner wall of the receiving chamber, wherein the support platform supports the sliding block, and the at least one first gas hole and the at least one second gas hole are located above the support platform.

3. The pressure protection device of claim 1, wherein one of the sliding block and the adjusting block is a magnetic block, and another one of the sliding block and the adjusting block is a metal block.

4. The pressure protection device of claim 1, further comprising a limiting member, wherein the limiting member comprises a movable shaft and a limit block, the movable shaft slidably extends through the sliding block, an end of the movable shaft is connected to the adjusting block, and another end of the movable shaft is connected to the limit block.

5. The pressure protection device of claim 4, wherein the limiting member further comprises an assembly member, the assembly member is sleeved on the movable shaft and is located between the limit block and the sliding block.

6. The pressure protection device of claim 5, wherein the assembly member comprises an elastic member.

7. The pressure protection device of claim 6, wherein the elastic member is a spring.

8. The pressure protection device of claim 1, wherein the housing defines a plurality of first gas holes, and a plurality of second gas holes.

9. The pressure protection device of claim 1, further comprising a limit platform disposed on an inner wall of the receiving chamber,
wherein the limit platform is located between the first gas hole and the second gas hole, and
when the pressure protection device is in the second state, the sliding block abuts against the limit platform.

10. An immersion cooling device comprising:
a seal chamber; and
a pressure protection device comprising:
a housing mounted on the seal chamber and communicating with the seal chamber, the housing comprising a receiving chamber communicating with the seal chamber and the housing defining at least one first gas hole and at least one second gas hole each communicating the receiving chamber to an ambient environment, the at least one first gas hole being closer to the seal chamber than to the at least one second gas hole;
a sliding block slidably disposed in the receiving chamber and dividing the receiving chamber into a first space and a second space, the first space communicating with the seal chamber, the sliding block defining a through hole communicating the first space with the second space; and
an adjusting block received in the first space, the adjusting block being configured to be attracted to the sliding block so that the through hole is selectively blocked by the adjusting block,
wherein the pressure protection device is switchable among a first state, a second state, and a third state,
in the first state, the at least one first gas hole is blocked by the sliding block, and the through hole is blocked by the adjusting block,
in the second state, the sliding block and the at least one first gas hole are staggered from each other, the at least one first gas hole communicates with the first space, and the through hole is blocked by the adjusting block, and
in the third state, the at least one first gas hole is blocked by the sliding block, the adjusting block is separated from the sliding block, and the first space communicates with the ambient environment through the through hole and the at least one second gas hole.

11. The immersion cooling device of claim 10, further comprising a pressure balance device communicating with the seal chamber.

12. The immersion cooling device of claim 11, wherein the pressure balance device is an airbag or an aluminum foil bag.

13. The immersion cooling device of claim 10, wherein the pressure protection device further comprises a support platform disposed on an inner wall of the receiving chamber, the support platform supports the sliding block, and the at least one first gas hole and the at least one second gas hole are located above the support platform.

14. The immersion cooling device of claim 10, wherein one of the sliding block and the adjusting block is a magnetic block, and another one of the sliding block and the adjusting block is a metal block.

15. The immersion cooling device of claim 10, wherein the pressure protection device further comprises a limiting member, the limiting member comprises a movable shaft and a limit block, the movable shaft slidably extends through the sliding block, an end of the movable shaft is connected to the adjusting block, and another end of the movable shaft is connected to the limit block.

16. The immersion cooling device of claim 15, wherein the limiting member further comprises an assembly member, the assembly member is sleeved on the movable shaft and is located between the limit block and the sliding block.

17. The immersion cooling device of claim 16, wherein the assembly member comprises an elastic member.

18. The immersion cooling device of claim 17, wherein the elastic member is a spring.

19. The immersion cooling device of claim 10, wherein the housing defines a plurality of first gas holes and a plurality of second gas holes.

20. The immersion cooling device of claim 10, wherein the pressure protection device further comprises a limit platform disposed on an inner wall of the receiving chamber, the limit platform is located between the first gas hole and the second gas hole, and
when the pressure protection device is in the second state, the sliding block abuts against the limit platform.

* * * * *